United States Patent
Tsui et al.

(10) Patent No.: US 7,362,594 B2
(45) Date of Patent: Apr. 22, 2008

(54) ADAPTIVE RESONANT SWITCHING POWER SYSTEM

(75) Inventors: Ping Tsui, Malden, MA (US); Michael S. Danielson, Wrentham, MA (US)

(73) Assignee: Apogee Technology, Inc., Norwood, MA (US)

( * ) Notice: Subject to any disclaimer, the term of this patent is extended or adjusted under 35 U.S.C. 154(b) by 0 days.

(21) Appl. No.: 10/541,227

(22) PCT Filed: Dec. 31, 2003

(86) PCT No.: PCT/US03/41512

§ 371 (c)(1),
(2), (4) Date: Feb. 16, 2006

(87) PCT Pub. No.: WO2004/062075

PCT Pub. Date: Jul. 22, 2004

(65) Prior Publication Data

US 2006/0152948 A1    Jul. 13, 2006

Related U.S. Application Data

(60) Provisional application No. 60/437,584, filed on Dec. 31, 2002.

(51) Int. Cl.
*H02M 3/335* (2006.01)

(52) U.S. Cl. .............. 363/22; 363/23; 363/21.12; 363/21.18

(58) Field of Classification Search .............. 363/22, 363/23, 21.12, 21.14, 21.16, 21.17, 21.18
See application file for complete search history.

(56) References Cited

U.S. PATENT DOCUMENTS

| | | | | |
|---|---|---|---|---|
| 4,646,217 A | * | 2/1987 | Baroni et al. | 363/17 |
| 5,268,830 A | * | 12/1993 | Loftus, Jr. | 363/17 |
| 5,446,350 A | * | 8/1995 | El-Hamamsy et al. | 315/248 |
| 5,962,987 A | * | 10/1999 | Statnic | 315/248 |
| 6,072,710 A | * | 6/2000 | Chang | 363/132 |

* cited by examiner

*Primary Examiner*—Bao Q. Vu
(74) *Attorney, Agent, or Firm*—Brian L. Michaelis

(57) ABSTRACT

A resonant switching power system operates with two resonant frequencies. A first frequency depends on the secondary leakage inductance of an output transformer and capacitor. The first frequency varies with changes in the load because load changes alter the leakage inductance. A second resonant frequency depends on the gate source capacitance of two MOSFET power devices in the circuit and the leakage inductance of the circuit's driving transformer. Power is thereby supplied that is always in phase with the load so that switching in the power supply occurs when current is near zero. High thermal efficiency is thereby achieved.

25 Claims, 7 Drawing Sheets

ADAPTIVE RESONANT SWITCHING POWER SYSTEM

CROSS REFERENCE TO RELATED APPLICATION

This Application Claims Priority To U.S. Provisional Patent Application No. 60/437,584 Filed Dec. 31, 2002

FIELD OF THE INVENTION

The present invention relates to power supply circuits and more particularly to a power converter having a first resonant frequency dependent upon leakage inductance of an output transformer and capacitor and a second resonant frequency dependent upon gate source capacitance of the circuit's power MOSFETs and leakage inductance of a driving transformer.

BACKGROUND OF THE INVENTION

Power conversion devices known in the art such as resonant DC-to-DC power converters are used to provide power in audio applications and in a number of other electronic applications. A popular type of resonant power converters is the well known class D power converter.

Class D converters operate by alternatively turning on and off a pair of power MOSFETs (metal oxide semiconductor field effect transistors) in response to a square wave switching signal. Current from the MOSFETs passes through a resonant capacitor and primary windings of a high frequency transformer which efficiently converts the pulsed high voltage MOSFET output to a suitably lower output voltage. Output from the secondary coils of the high frequency transformer are rectified and filtered to provide smooth DC voltage of an appropriate magnitude for many electronic applications.

Resonant power converters have good thermal efficiency under ideal conditions because the switching signal to the MOSFETs is timed to turn each MOSFET off when the current through it is zero and the switching signal to the MOSFETs is timed to turn each MOSFET on when the voltage across it is zero. Under ideal conditions, each MOSFET is switched at a 50% duty cycle. However, in non-ideal conditions, the switching duty cycle is typically varied to provide voltage regulation as the input voltage varies. Variation in the duty cycle causes at least one of the MOSFETs to turn off when it carries non-zero current or turn on with non-zero voltage thereby introducing thermal losses.

U.S. Pat. No. 5,986,895 to Stewart et al. discloses a method of maintaining zero current switching of MOSFETS under non-ideal conditions in a resonant power converter. This method senses the transformer primary current and the output voltage and uses digital logic to modify the MOSFET switching signal. The digital logic is designed so that the modified switching signal switches the MOSFETs at zero current even under non-ideal conditions such as asymmetric duty cycles.

Digital "brute force" methods such as the method disclosed in the Stewart et al. Patent, require a number of design compromises including increased real estate consumption on a board or chip. Also, significant additional design time and complexity is added to component layout in order to place such a digital system in close proximity to the high frequency switching components in a resonant power converter. Each of these disadvantages adds significant cost to any power converter using this technique which can make their use prohibitively expensive for many applications.

SUMMARY OF THE INVENTION

The adaptive resonant switching power system according to an illustrative embodiment of the present invention operates with two resonant frequencies. A first frequency depends on leakage inductance of an output transformer and capacitor. The first frequency varies with changes in the load because load changes alter the leakage inductance. In an illustrative embodiment of the invention, the first frequency is used as the power converter's switching frequency when the load current is above approximately 10% of the converter's maximum load magnitude.

A second resonant frequency depends on the gate source capacitance of two MOSFET power devices in the circuit and the leakage inductance of the circuit's driving transformer. In the illustrative embodiment, the second resonant frequency is used as the power converter's switching frequency when the load falls below approximately 10% of the full load magnitude.

The driving transformer includes a pair of drive coils and a sense coil. The sense coil senses the load current in the output transformer secondary circuit. The drive coils are arranged to drive a pair of MOSFETs 180 degrees out of phase. When operating in the load dependent region, (over 10% of maximum load magnitude), the phase reversal of the load current causes phase reversal of the drive to the MOSFETs so that zero current switching, and zero voltage switching, with no cross conduction is always maintained regardless of the particular load reactance. In the illustrative embodiment, the gate-source capacitance becomes part of the oscillator for the base frequency, (under about 10% of maximum load magnitude). The specially designed current sensing transformer according to the present invention drives the two power MOSFETs so that a gate charge oscillates between the two MOSFETs (from one to the other), The MOSFETs thereby always operate even under no load conditions, i.e., when there is no secondary load current. The invention thereby minimizes the power dissipation and allows the design of a very small and efficient switching power transformer.

The present invention features a power converter having a first resonant frequency that depends on the reactance of a load. Changes in the resonant frequency of the power converter according to the invention occur according to changes in load capacitance or inductance such that the frequency is inversely proportional to the square root of the product of inductance and capacitance. Further, the core material of the output transformer is chosen such that its relative permeability decreases with increasing load current, lowering the leakage inductance and raising the frequency. External capacitance and inductance can be chosen to set the initial frequency as required.

Because the power converter will always operate at its highest resonant frequency, it is important that the load dependent frequency be higher than the base frequency determined by the MOSFET gate source capacitance and the inductance of the driving transformer.

The invention thereby features a switching power converter that switches at times of zero load current. Since no current flows during the switching transient, power (IR) losses are extremely low. The present invention features efficiency of 90% or greater and operates without a minimum load.

An illustrative embodiment of the invention includes an adaptive resonant power converter having a gate drive transformer. The gate drive transformer includes a first sensing primary winding, a first secondary winding, and a second secondary winding. The illustrative embodiment also includes a first MOSFET having a gate connected to the first secondary winding and a second MOSFET having a gate connected to the second secondary winding. The first and second MOSFETS are connected to each other in series across a direct current input source and form a common MOSFET node therebetween at the first MOSFET source and the second MOSFET drain. An input capacitor is connected across the direct current input source. The input capacitor has a first capacitor node connected to the first MOSFET drain and a second capacitor node connected to the second MOSFET source.

The illustrative embodiment also includes a main transformer having a primary winding and a first resonant output winding. The main transformer primary winding is connected between the common MOSFET node and the second capacitor node. A first tap of the first resonant output winding is connected to a first tap of the first sensing primary winding. A second tap of the first resonant output winding is connected to a first load terminal of a first load. A second tap of the first sensing primary winding is connected to a second load terminal of the first load.

In an illustrative embodiment, the gate drive transformer also includes a protection diode winding connected in parallel with a pair of parallel voltage limiting diodes, the voltage limiting diodes having opposite orientations. A compensation capacitor can be connected between the gate and source of each MOSFET to provide resonant oscillation with the first secondary winding and the second secondary winding. A damping resistor can be connected in series between each of the MOSFET gates and its corresponding secondary winding on the gate drive transformer.

Because of its high efficiency, the present invention also features low heat dissipation and thereby requires small heat sinks. Accordingly, devices incorporating the power converter according to the present invention can be designed with smaller and less expensive packaging for a given power rating.

The present invention is also capable of very low radio frequency interference (RFI) emissions because of the zero current switching and features smaller transformers that are less bulky and lighter than transformers used in prior art switching power converters.

The present invention also minimizes the need for high frequency circuit board layouts that are difficult to manufacture. For example, the circuit board layout in the present invention is less critical than non resonant designs and the composition of circuit boards that can be used in the present invention is not critical. Manufacturing costs are thereby reduced due to ease of manufacturing.

The present invention also features advantages for use in audio applications because the switching power converter according to the invention has fast dynamic response due to changes in the resonant frequency as a function of the load.

BRIEF DESCRIPTION OF THE DRAWINGS

The foregoing and other features and advantages of the present invention will be more fully understood from the following detailed description of illustrative embodiments taken in conjunction with the accompanying drawings in which.

DETAILED DESCRIPTION

Figure 1:
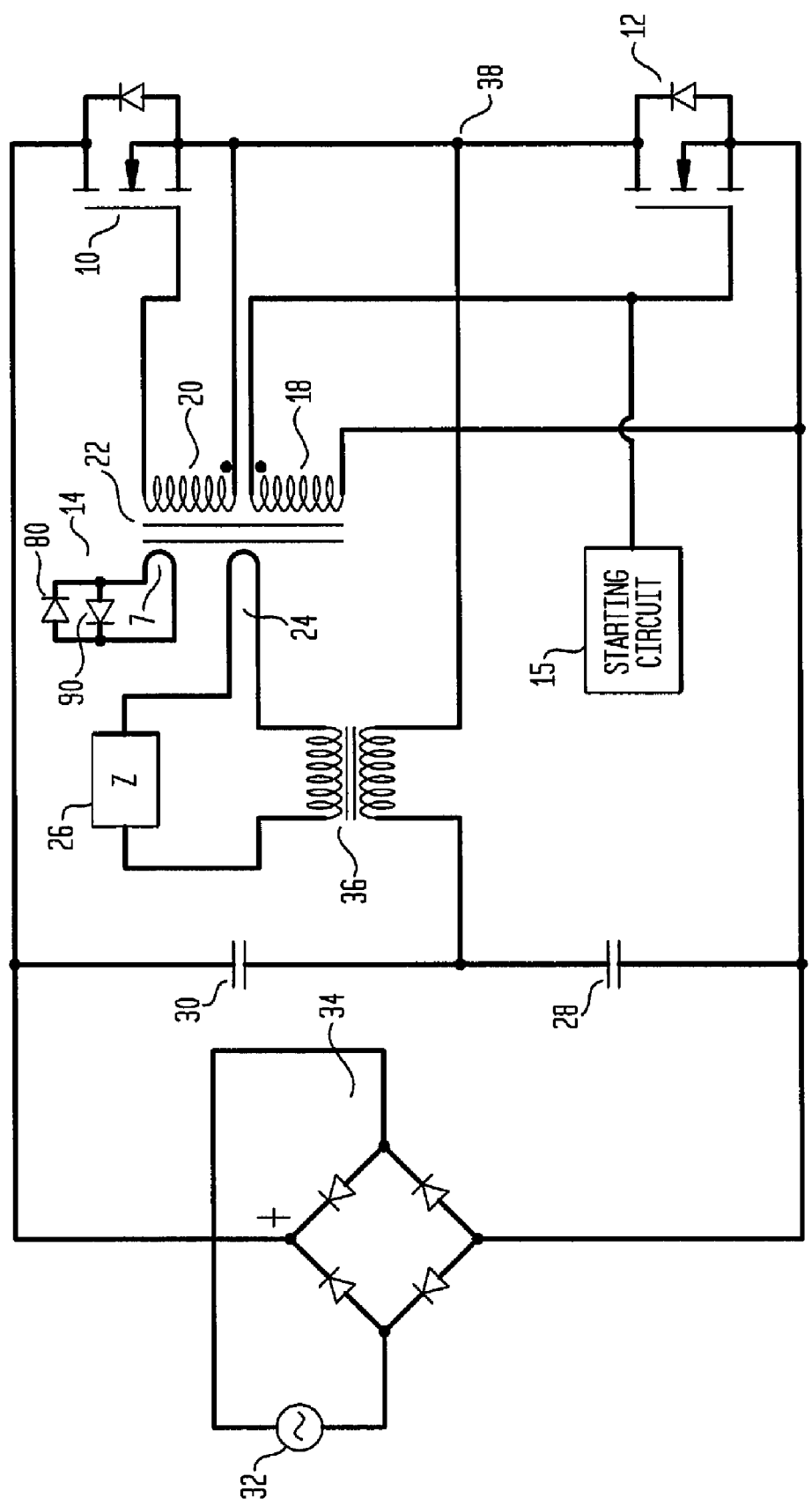
FIG. 1 is a schematic circuit diagram of a resonant power system driving an alternating current (hereinafter "AC") load according to an illustrative embodiment of the present invention.

An illustrative embodiment of the present invention is described with reference to FIG. 1. A gate drive transformer 14 includes a core 22, primary coil 24, two secondary coils 20, 18, and an auxiliary coil 7. The primary coil 24 is connected between the load and the secondary of transformer 36. The first secondary coil 20 is connected between the gate and source of first MOSFET 10, the secondary coil 18 is connected between the gate and source of second MOSFET 12. The auxiliary coil 7 is connected across a pair of rectifier diodes 80, 90. A rectified power source from an AC input 32 through a bridge rectifier 34 is connected between the source of second MOSFET 12 and the drain of first MOSFET 10. A pair of capacitors 30, 28 are also connected in series with each other and in parallel with the MOSFETs across the rectified power input. The source of the first MOSFET 10 is connected to the drain of the second MOSFET 12 at a common node 38. A sensor coil 24 is included in the primary windings of the gate drive transformer 14. The sensor coil 24 is in series with the load 26. The sensor coil 24 and load 26 are connected across the secondary windings of the second transformer 36. One tap of the primary winding of the second transformer 36 is connected to the common node 38. The other tap of the primary winding of the second transformer 36 is connected to a node between the two capacitors 30, 28.

In the illustrative embodiment, the resonant switching power converter according to the invention uses a varied frequency. The inherent gate source capacitances of the power MOSFETs 10, 12 are used, in conjunction with the inductance formed by secondary coils 20 and 18, as an oscillating element. One resonant frequency, hereinafter referred to as the base frequency, depends only upon the leakage inductance of the gate drive transformer 14 and the inherent gate-source capacitance of the power MOSFETs 10, 12. Those skilled in the art will recognize that the frequency of this oscillator is inversely proportional to the square root of the product of twice the individual drive coil inductance and the MOSFET gate-source capacitance according to the relation $f=1/\sqrt{4L*\frac{1}{2}C}$ where "f" is the oscillator frequency in radians per second, "L" is the drive coil inductance in Henrys and "C" is the MOSFET gate-source capacitance in Farads.

Another resonant frequency, hereinafter referred to as the load frequency, depends only upon the equivalent circuit resonant frequency of the load and the transformer 36, secondary current. In the illustrative embodiment, the power converter according to the invention always operates on the higher of the two frequencies. For example, when the load current falls below a predetermined limit, the power converter switches at the base frequency. When the load frequency is above the preselected limit, the power supply switches at the load frequency, which is higher than the base frequency. In normal operation, the power supply is switching at the load frequency most of the time and switching in phase with the load current thereby minimizing thermal losses and maximizing efficiency. When the circuit is operating on the load frequency, the gate drive transformer 14 drives the MOSFETs, driven by the secondary current in main transformer 36 and switching at the zero crossing. When the power supply is switching at the base frequency, the gate drive transformer 14 also drives the MOSFETs 10, 12.

The gate drive transformer 14 is specially designed to force the two power MOSFETs 10, 12 to drive each other out of phase. The resonance between the two power MOSFETs creates ideal working conditions requiring very low driving power. This minimizes power dissipation in the power supply, provides very high efficiency and allows the power converter to operate with no load current.

For proper operation it is important that the core material for the gate drive transformer 14 be selected such that the base frequency formed by the leakage inductance and the MOSFET 10,12 input capacitance be lower than the load frequency formed by the secondary leakage inductance of main transformer 36 and the load reactance. Further, the core material chosen for the main transformer 36 should provide characteristics such that the secondary leakage inductance decreases with higher flux density. That is, the load frequency will increase with increasing load current. The characteristics of both circuits should be chosen such that the base frequency and load frequency are the same at approximately 10% of the maximum load magnitude to facilitate a smooth crossover between operating modes.

The load frequency of the switching power supply according to the invention is also maintained by responding to changes in reactance of the load 26. For example, when the load becomes more inductive or capacitive the switching frequency (load frequency) of the power supply decreases but maintains the zero current switching feature. By keeping the power supply switching frequency in phase with the load frequency, the load voltage is always in phase with the load current. Power dissipation at the main transformer 36 core and the power MOSFETs 10, 12 is thereby minimized. This allows reductions in the size of main transformers and the heat sinks of the switching power supplies according to the invention.

The auxiliary coil 7 is used in combination with rectifier diodes 80, 90 to limit the voltage that can be generated by secondary coils 18, 20. This provides protection by limiting the voltage applied across the gate and source of MOSFETs 10, 12. This feature can eliminate the need of other more expensive means for protecting the MOSFET gates from voltage breakdown.

A starting circuit 15 is required to start the base frequency oscillation between the two MOSFETs. Starting circuits are well known. A starting circuit 15 as depicted in FIG. 1 can easily be configured by persons having skill in the art. Although a starting circuit 15 is required in each of the embodiments described herein, the starting circuit it is not shown in FIGS. 2-7 for clarity.

Figure 2:
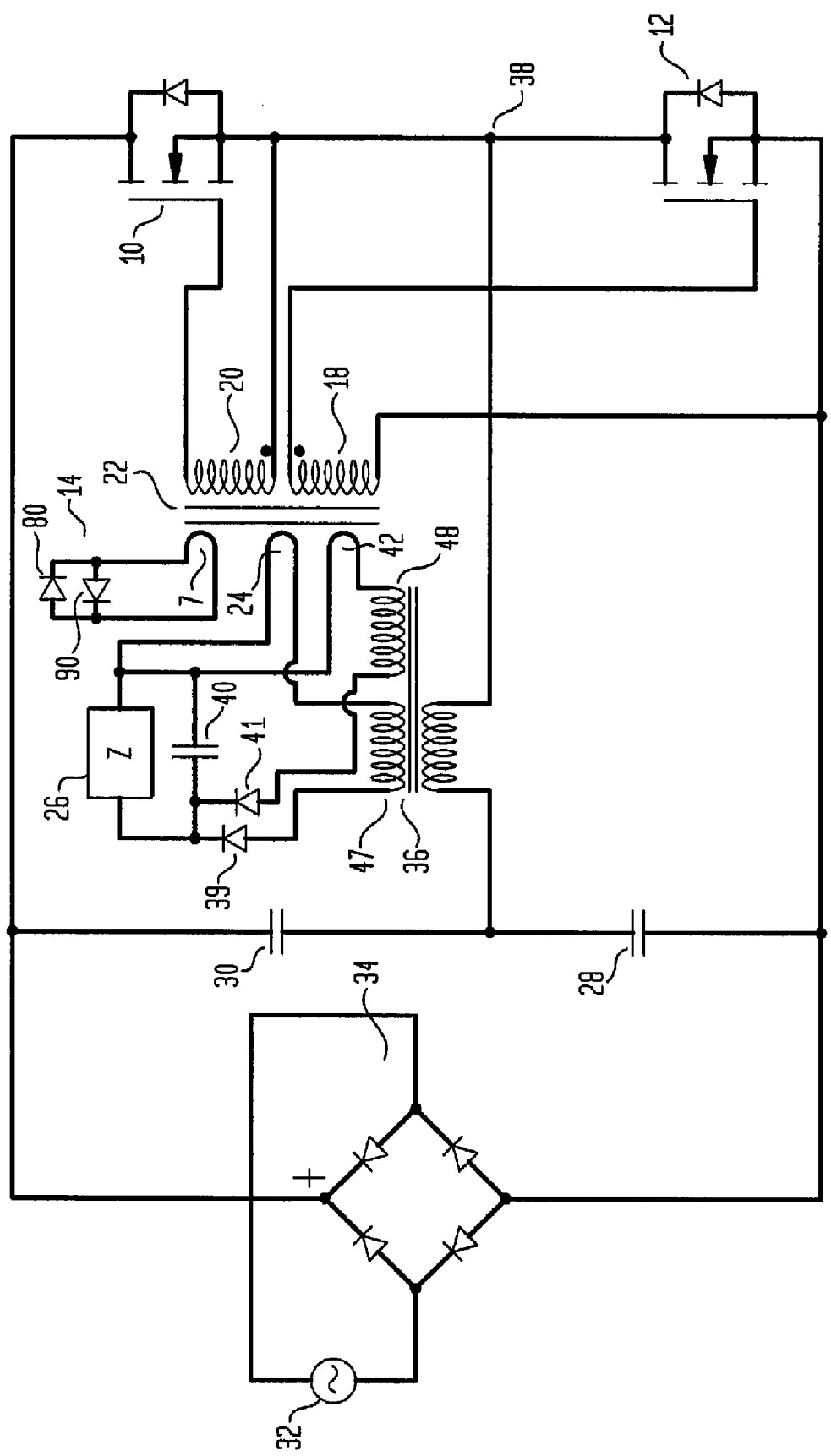
FIG. 2 is a schematic circuit diagram of a resonant power system driving a direct current (hereinafter "DC") load according to an alternative embodiment of the present invention.

The illustrative embodiment of the invention described hereinbefore is configured to provide an AC output. Those skilled in the art will appreciate that all the advantages of the converter can be maintained for a rectified DC output by constructing an alternative embodiment. One such alternative embodiment is shown in FIG. 2 wherein a first rectifier diode 39 and an appropriate filter (not shown) is placed between the secondary of output transformer 36 and the load, a capacitive storage element 40 is placed at the output of the diodes, and a second output circuit is added. In the second output circuit, a second output winding 48 having the same number of turns as the first output winding 47 is added to main transformer 36 and a second sense coil 42 having the same number of turns as the first sense coil 24 is added to gate drive transformer 14. The second output circuit is connected with its own output winding 48 and sense coil 42 in a configuration like the first output circuit except having an opposite polarity of sense coil 42 and output winding 48. The second rectifier diode 41 is connected between the first rectifier diode 39 at capacitor 40 and the second output winding 48 of transformer 36 such that the first 39 and second 41 rectifier diodes are oriented in the same direction relative to the load 26. The first 39 and second 41 rectifier diodes thereby conduct on opposite phases of the driving signal to main transformer 36. The first 24 and second 42 sense coils are connected to the opposite end of the capacitive storage element 40 in the filter from the end where the first 39 and second 41 rectifier diodes are connected in common. The polarity of the connection of the second sense coil 42 of gate drive transformer 14 is such that the proper alternating drive to MOSFETs 10 and 12 is maintained.

Figure 3:
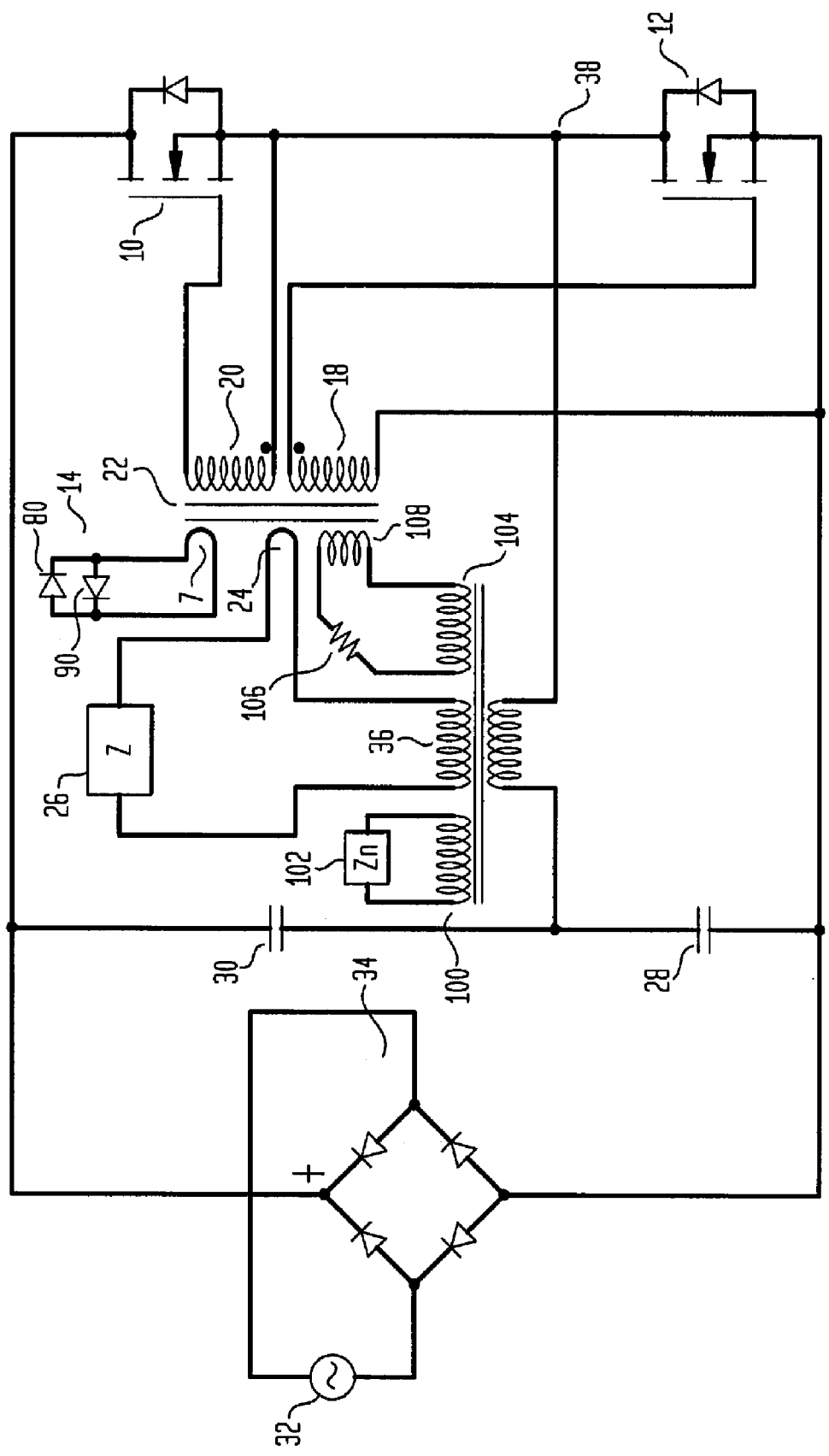
FIGS. 3-5 are schematic circuit diagrams of a resonant power system driving one or more additional loads according to alternative embodiments of the present invention.

Another embodiment of the invention is shown in FIG. 3 in which one or more auxiliary load coils 100 can be added the main transformer 36 to provide power to one or more additional loads 102. In this embodiment, a first additional gate drive coil 104 is added to the main transformer and connected through a resistor 106 to a second additional gate drive coil 108 in the first transformer 14.

The one or more auxiliary load coils 100 in the main transformer 36 provide additional power taps or voltages from the transformer 36. Such additional power taps are commonly desirable in the industry. Additional loads can thereby by connected to the main transformer in parallel to the main load 26 that drives the MOSFET switching control.

The first and second additional gate drive coils 104, 108 are used in this embodiment to efficiently drive additional loads that are connected to drive the MOSFET gates when the main output is unloaded, i.e. when zero current flows through load 26. Even thought the converter will operate on the gate oscillator frequency when the main output is unloaded as previously described, the relatively small parasitic energy oscillating between the MOSFETs may not transition the MOSFETs quickly enough to provide efficient switching of power to the additional loads.

In such an embodiment, efficiency is improved by adding an auxiliary coil to both the main transformer and the gate drive transformer. The function of this coil is to provide additional energy and feedback to the gate drive circuit to increase the speed of transition between states of the MOSFETS. Peak efficiency is thereby achieved because the MOSFETS are driven with enough energy to transition quickly and spend maximum time in the saturated operating region (either fully on or fully off). This avoids thermal losses that could otherwise result from slow transitions when the MOSFETS are driving an auxiliary load.

Figure 4:
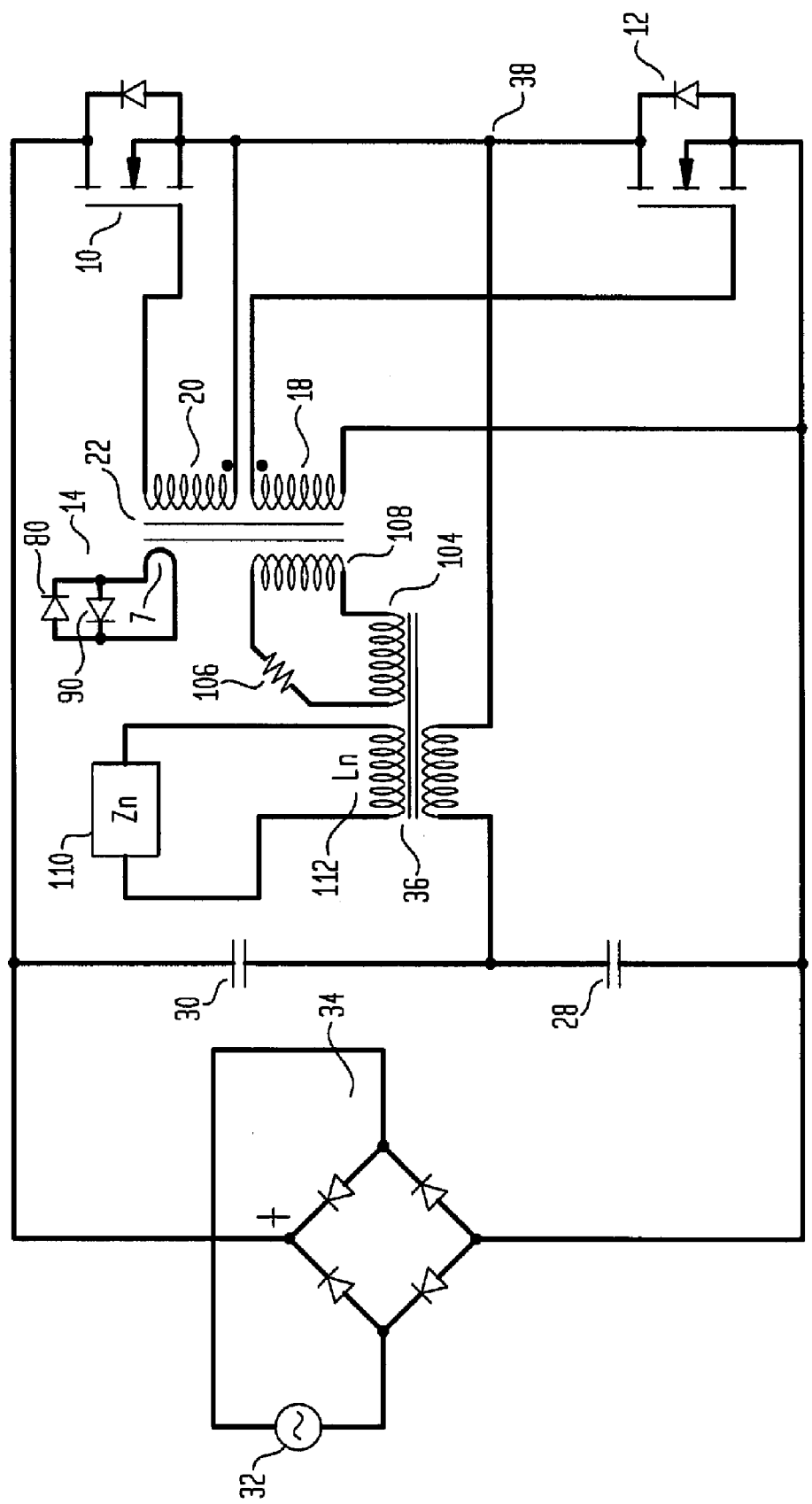

In one embodiment, as shown in FIG. 4, additional gate drive coils 104 and 108 and resistor 106 are provided to replace (rather than supplement) the primary load 26 and first sense coil 24. In this embodiment, one or more loads (Zn) 110 can be added in parallel using a corresponding number of coils (Ln) 112 that tap into the main transformer 36. Any or all of these loads 110 can be switched open without causing thermal losses because the additional gate drive coils 104, 108 are always providing feedback to the gate drive transformer 14.

Figure 5:
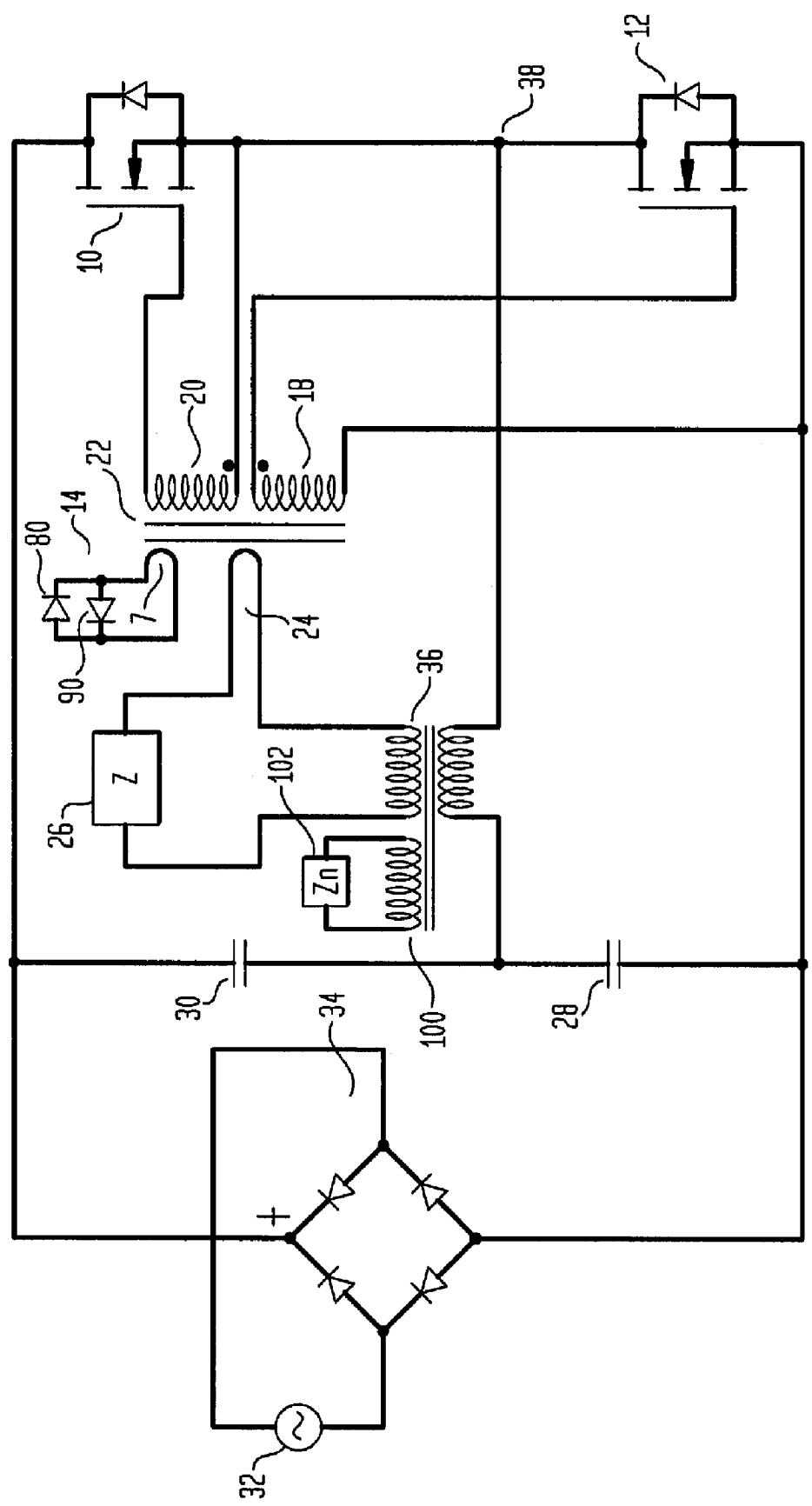

As shown in FIG. 5, additional loads could also be efficiently driven according to the present invention without providing additional gate drive coils if the primary load 26 is required to remain switched into the circuit at all times. If such a restriction is maintained, the additional loads 102 can be switched in or out of the circuit and/or draw varying or zero current without causing thermal losses in the MOSFETS 10, 12.

Although the embodiment shown in FIGS. 3-5 are described in terms of a circuit for providing AC power to a load, persons skilled in the art should appreciate that additional gate drive coils 104, 108 and resistor 106 can be added in the same manner to allow efficient operation of additional loads in an DC power circuit according to the present invention such as the circuit shown in FIG. 2.

Figure 6:
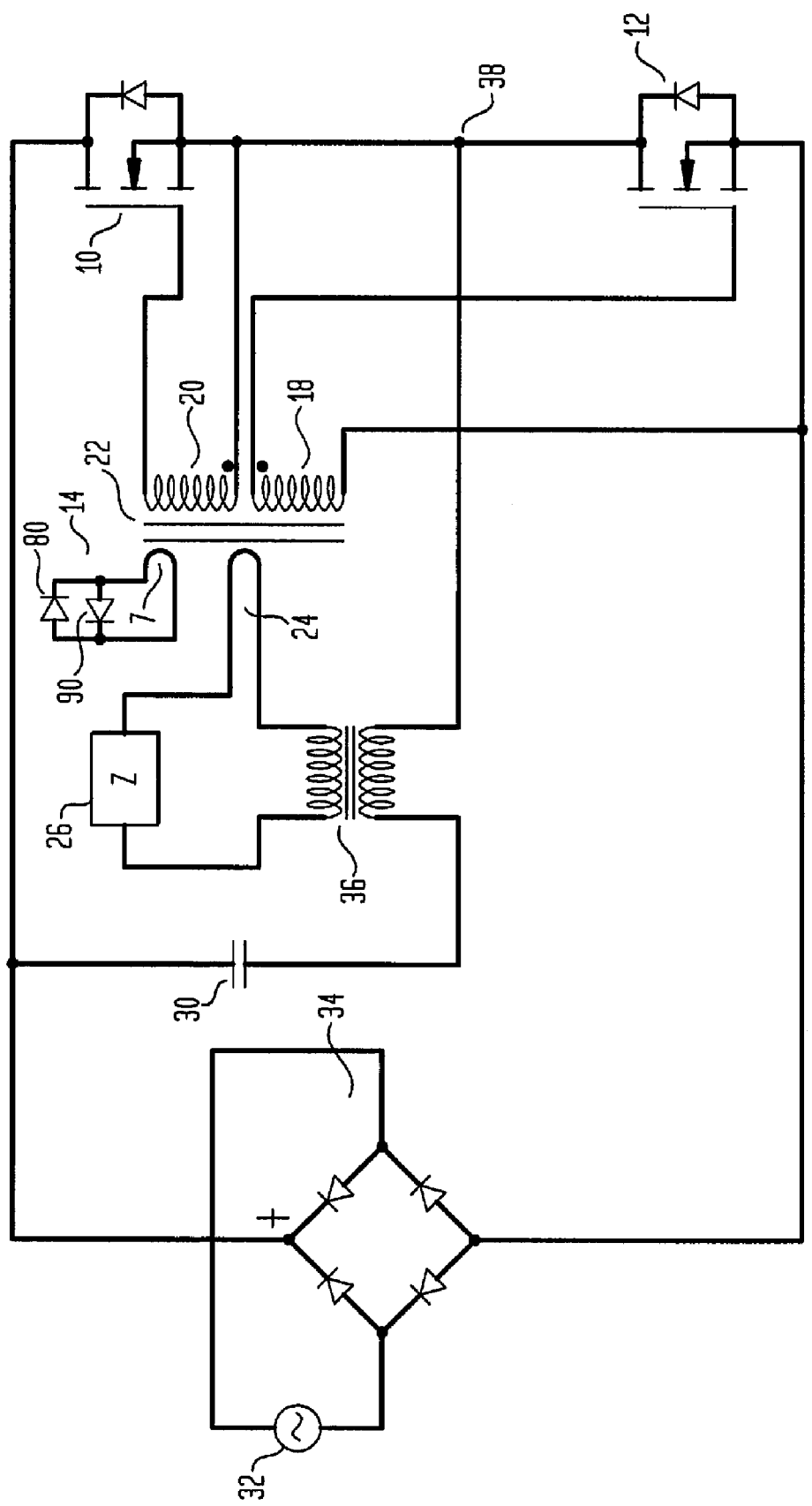
FIG. 6 is a schematic circuit diagram of a resonant power system having a single input capacitor according to an alternative embodiment of the present invention.

In certain embodiments of the present invention as shown in FIG. 6, only a single capacitor 30 is connected between the input rectifier bridge 34 and primary winding of the main transformer 36. For example, in applications wherein the present invention provides power in ranges up to from about 700 W to about 1000 W a single capacitor 30 connected between the input rectifier bridge 34 and the primary winding of the main transformer 36 as shown is sufficient. Persons skilled in the art should appreciate that a large single capacitor could also be used at higher power levels, however the size of such capacitors usually makes their use impractical.

It will typically be advantageous to use one type of gate drive transformer 14 with various types of MOSFETs 10, 12 that are selected according to the power requirements of a particular application. Rather than designing a new gate drive transformer 14 with a leakage inductance to match the gate capacitance of each particular pair of MOSFETs, persons skilled in the art should appreciate that it is less costly to install compensation capacitors 114, 116 as shown in FIG. 7 between the gate and source of the MOSFETS 10, 12 such that the compensated gate/source capacitance is tuned to the leakage inductance of the gate drive transformer as described hereinbefore.

Figure 7:
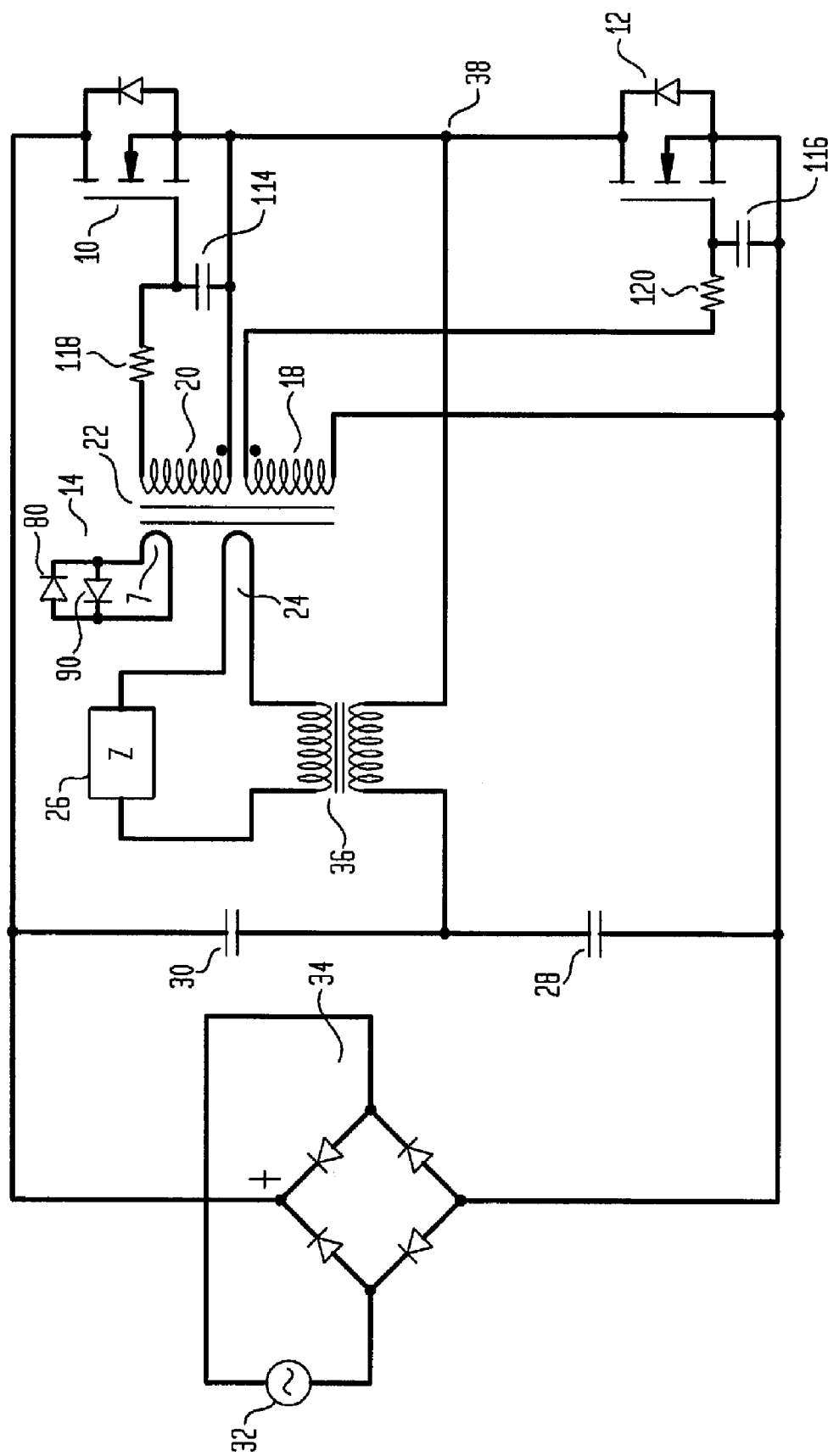
FIG. 7 is a schematic circuit diagram of a resonant power system including optional compensation capacitors and damping resistors according to alternative embodiments of the present invention.

In still another embodiment of the present invention, damping resistors 118, 120 can be connected between the gate of the MOSFETS 10, 12 and the gate drive transformer 14 as shown in FIG. 7 to damp spurious oscillations as known in the art. Such resistors are typically in the range of from about less than one ohm to about greater than two ohms.

Although the embodiments shown in FIGS. 6-7 are described in terms of a circuit for providing AC power to a load, persons skilled in the art should appreciate that a single input capacitor 30 as shown in FIG. 6, compensation capacitors 116, 114 and low value resistors 118, 120 as shown in FIG. 7 can be added in the same manner to provide design and manufacturing flexibility in an DC power circuit according to the present invention such as the circuit shown in FIG. 2.

Although the invention has been shown and described with respect to exemplary embodiments thereof, various other changes, omissions and additions in the form and detail thereof may be made therein without departing from the spirit and scope of the invention.

What is claimed is:

1. An adaptive resonant power converter comprising:
a gate drive transformer comprising a first sensing primary winding, a first secondary winding, and a second secondary winding;
a first MOSFET having a gate connected to said first secondary winding;
a second MOSFET having a gate connected to said second secondary winding;
said first and second MOSFETS connected to each other in series across a direct current input source and forming a common MOSFET node therebetween at said first MOSFET source and said second MOSFET drain;
a main transformer comprising a primary winding and a first resonant output winding;
an input capacitor having a first capacitor node connected to said first MOSFET drain and a second capacitor node connected to said main transformer primary winding;
said main transformer primary winding connected between said common MOSFET node and said second capacitor node; and
wherein a first tap of said first resonant output winding is connected to a first tap of said first sensing primary winding, a second tap of said first resonant output winding is connected to a first load terminal of a first load, and a second tap of said first sensing primary winding is connected to a second load terminal of said first load.

2. The converter according to claim 1 wherein said gate drive transformer further comprises a protection diode winding connected in parallel with a pair of parallel voltage limiting diodes, said voltage limiting diodes having opposite orientations.

3. The converter according to claim 1 further comprising:
a first rectifier diode connected between said first resonant output winding and said first load terminal;
a second output circuit having second resonant output winding on said main transformer with the same number of turns as said first resonant output winding;
a second sensing primary winding on said gate drive transformer having the same number of turns as said first primary output winding;
wherein a first tap of said second resonant output winding is connected to a first tap of said second sensing primary winding, a second tap of said second resonant output winding is connected through said second rectifier diode to a first load terminal, and a second tap of said second sensing primary winding is connected to said second load terminal;
a second rectifier diode connected between said first load terminal and said second resonant output winding such that said first and second rectifier diodes are oriented in the same direction relative to said load; and
a capacitor connected to the output of said fist and second diodes.

4. The converter according to claim 1 further comprising one or more additional loads connected across corresponding additional resonant output windings on said main transformer wherein said first load is required to remain connected in a closed circuit with said first resonant output windings and said first sensing primary winding.

5. The converter according to claim 1 further comprising one or more additional loads connected across corresponding additional output windings on said main transformer; and a dedicated resonant output winding on said main transformer operatively connected to a corresponding dedicated primary sense winding on said gate drive transformer.

6. The converter according to claim 1 further comprising a compensation capacitor connected between the gate and source of each MOSFET to provide resonant oscillation with said first secondary winding and said second secondary winding.

7. The converter according to claim 1 further comprising a damping resistor connected in series between each of said MOSFET gates and its corresponding secondary winding on said gate drive transformer.

8. An adaptive resonant power converter comprising:
a gate drive transformer comprising a first sensing primary winding, a first secondary winding, and a second secondary winding;
a first MOSFET having a gate connected to said first secondary winding;
a second MOSFET having a gate connected to said second secondary winding;
said first and second MOSFETS connected to each other in series across a direct current input source and forming a common MOSFET node therebetween at said first MOSFET source and said second MOSFET drain;
an input capacitor connected across said direct current input source and having a first capacitor node connected to said first MOSFET drain and a second capacitor node connected to said second MOSFET source;
a main transformer comprising a primary winding and a first resonant output winding;
said main transformer primary winding connected between said common MOSFET node and said second capacitor node;
wherein a first tap of said first resonant output winding is connected to a first tap of said first sensing primary winding, a second tap of said first resonant output winding is connected to a first load terminal of a first load, and a second tap of said first sensing primary winding is connected to a second load terminal of said first load;
wherein said gate drive transformer further comprises a protection diode winding connected in parallel with a pair of parallel voltage limiting diodes, said voltage limiting diodes having opposite orientations;
a compensation capacitor connected between the gate and source of each MOSFET to provide resonant oscillation with said first secondary winding and said second secondary winding; and
a damping resistor connected in series between each of said MOSFET gates and its corresponding secondary winding on said gate drive transformer.

9. The converter according to claim 8 further comprising one or more additional loads connected across corresponding additional output windings on said main transformer wherein said first load is required to remain connected in a closed circuit with said first resonant output windings and said first sensing primary winding.

10. The converter according to claim 8 further comprising one or more additional loads connected across corresponding additional output windings on said main transformer; and a dedicated resonant output winding on said main transformer operatively connected to a corresponding dedicated primary sense winding on said gate drive transformer.

11. The converter according to claim 8 further comprising a compensation capacitor connected between the gate and source of each MOSFET to provide resonant oscillation with said first secondary winding and said second secondary winding.

12. The converter according to claim 8 further comprising a damping resistor connected in series between each of said MOSFET gates and its corresponding secondary winding on said gate drive transformer.

13. The converter according to claim 8 wherein said gate drive transformer further comprises a protection diode winding connected in parallel with a pair of parallel voltage limiting diodes, said voltage limiting diodes having opposite orientations.

14. An adaptive resonant power converter comprising:
a gate drive transformer comprising a first sensing primary winding, a first secondary winding, and a second secondary winding;
a first MOSFET having a gate connected to said first secondary winding;
a second MOSFET having a gate connected to said second secondary winding;
said first and second MOSFETS connected to each other in series across a direct current input source and forming a common MOSFET node therebetween at said first MOSFET source and said second MOSFET drain;
a first and second input capacitor connected to each other in series across said direct current input source and forming a common capacitor node therebetween;
a main transformer comprising a primary winding and a first resonant output winding;
said primary winding connected between said common MOSFET node and said common capacitor node; and
wherein a first tap of said first resonant output winding is connected to a first tap of said first sensing primary winding, a second tap of said first resonant output winding is connected to a first load terminal of said first load, and a second tap of said first sensing primary winding is connected to a second load terminal of said first load.

15. The converter according to claim 14 further comprising
a first rectifier diode connected between said first resonant output winding and said first load terminal;
a capacitor connected across said load from said first load terminal to said second load terminal;
a second output circuit having second resonant output winding on said main transformer with the same number of turns as said first resonant output winding;
a second sensing primary winding on said gate drive transformer having the same number of turns as said first primary output winding;
wherein a first tap of said second resonant output winding is connected to a first tap of said second sensing primary winding, a second tap of said second resonant output winding is connected through said second rectifier diode to a first load terminal, and a second tap of said second sensing primary winding is connected to said second load terminal;
a second rectifier diode connected between said first load terminal and said second resonant output winding such that said first and second rectifier diodes are oriented in the same direction relative to said load.

16. The converter according to claim 14 further comprising one or more additional loads connected across corresponding additional output windings on said main transformer wherein said first load is required to remain connected in a closed circuit with said first resonant output windings and said first sensing primary winding.

17. The converter according to claim 14 further comprising one or more additional loads connected across corresponding additional output windings on said main transformer; and a dedicated resonant output winding on said main transformer operatively connected to a corresponding dedicated primary sense winding on said gate drive transformer.

18. The converter according to claim 14 further comprising a compensation capacitor connected between the gate and source of each MOSFET to provide resonant oscillation with said first secondary winding and said second secondary winding.

19. The converter according to claim 14 further comprising a damping resistor connected in series between each of said MOSFET gates and its corresponding secondary winding on said gate drive transformer.

20. The converter according to claim 14 wherein said gate drive transformer further comprises a protection diode winding connected in parallel with a pair of parallel voltage limiting diodes, said voltage limiting diodes having opposite orientations.

21. The converter according to claim 15 further comprising one or more additional loads connected across corresponding additional resonant output windings on said main transformer wherein said first load is required to remain connected in a closed circuit with said first resonant output windings and said first sensing primary winding.

22. The converter according to claim 15 further comprising one or more additional loads connected across corresponding additional output windings on said main transformer; and a dedicated resonant output winding on said main transformer operatively connected to a corresponding dedicated primary sense winding on said gate drive transformer.

23. The converter according to claim 15 further comprising a compensation capacitor connected between the gate and source of each MOSFET to provide resonant oscillation with said first secondary winding and said second secondary winding.

24. The converter according to claim 15 further comprising a damping resistor connected in series between each of said MOSFET gates and its corresponding secondary winding on said gate drive transformer.

25. The converter according to claim 15 wherein said gate drive transformer further comprises a protection diode winding connected in parallel with a pair of parallel voltage limiting diodes, said voltage limiting diodes having opposite orientations.

* * * * *